(12) United States Patent
Tamaki

(10) Patent No.: US 12,279,529 B2
(45) Date of Patent: Apr. 15, 2025

(54) THERMOELECTRIC CONVERSION UNIT

(71) Applicant: Panasonic Intellectual Property Management Co., Ltd., Osaka (JP)

(72) Inventor: Hiromasa Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 137 days.

(21) Appl. No.: 18/057,760

(22) Filed: Nov. 21, 2022

(65) Prior Publication Data

US 2023/0079123 A1 Mar. 16, 2023

Related U.S. Application Data

(63) Continuation of application No. PCT/JP2021/019290, filed on May 21, 2021.

(30) Foreign Application Priority Data

Jun. 15, 2020 (JP) .................................. 2020-103069

(51) Int. Cl.
*H10N 10/17* (2023.01)
*H10N 10/13* (2023.01)

(52) U.S. Cl.
CPC ............. *H10N 10/17* (2023.02); *H10N 10/13* (2023.02)

(58) Field of Classification Search
None
See application file for complete search history.

(56) References Cited

U.S. PATENT DOCUMENTS 4,463,214 A * 7/1984 Lowther ................ H10N 10/17
136/211
2013/0340801 A1 12/2013 Zhang et al.
(Continued)

FOREIGN PATENT DOCUMENTS

DE   10 2010 054 432   6/2012
JP   2005-083251       3/2005
(Continued)

OTHER PUBLICATIONS

Extended European Search Report issued Oct. 18, 2023 in corresponding European Patent Application No. 21824914.2.
(Continued)

*Primary Examiner* — Tamir Ayad
(74) *Attorney, Agent, or Firm* — Wenderoth, Lind & Ponack, L.L.P.

(57) ABSTRACT

A thermoelectric conversion unit includes first fluid flow path sections facing each other; a second fluid flow path section between the first fluid flow path sections; a first thermoelectric module between the second fluid flow path section and one of the first fluid flow path sections; a second thermoelectric module between the second fluid flow path section and the other of the first fluid flow path sections; and heat transfer plates in the second fluid flow path section. The heat transfer plates face each other along a direction from the first thermoelectric module toward the second thermoelectric module. At least one of the heat transfer plates includes an opening, and a baffle projecting from a peripheral edge of the opening and being configured to baffle a second fluid passing through the opening to flow in a direction toward the first thermoelectric module or the second thermoelectric module.

9 Claims, 7 Drawing Sheets

(56) References Cited

U.S. PATENT DOCUMENTS

2014/0345662 A1 11/2014 Gauss et al.
2020/0141299 A1 5/2020 Kawaguchi et al.

FOREIGN PATENT DOCUMENTS

| JP | 2011-119420 | 6/2011 |
| JP | 2013-093466 | 5/2013 |
| JP | 2014-105605 | 6/2014 |
| WO | 2007/026432 | 3/2007 |

OTHER PUBLICATIONS

International Search Report of PCT application No. PCT/JP2021/019290 dated Jun. 29, 2021.

* cited by examiner

THERMOELECTRIC CONVERSION UNIT

BACKGROUND

1. Technical Field

The present disclosure relates to a thermoelectric conversion unit converting thermal energy to electrical energy.

2. Description of the Related Art

There is known a thermoelectric conversion unit converting thermal energy to electrical energy (see, for example, Japanese Unexamined Patent Application Publication No. 2005-83251). The related-art thermoelectric conversion unit includes a low-temperature fluid flow path section through which a low-temperature fluid flows, a high-temperature fluid flow path section through which a high-temperature fluid flows, and a thermoelectric module disposed between the low-temperature fluid flow path section and the high-temperature fluid flow path section. The thermoelectric module converts thermal energy, given as a temperature difference between the high-temperature fluid flowing through the high-temperature fluid flow path section and the low-temperature fluid flowing through the low-temperature fluid flow path section, to electrical energy by utilizing the Seebeck effect.

The above-described related-art thermoelectric conversion unit further includes corrugated plate fins that are disposed in the high-temperature fluid flow path section and that are stacked in a predetermined direction. Heat of the high-temperature fluid flowing through the high-temperature fluid flow path section is transferred to each of a pair of thermoelectric modules through the plate fins.

SUMMARY

In the related-art thermoelectric conversion unit described above, the high-temperature fluid flow path section is partitioned by the plate fins into flow paths arrayed in the predetermined direction. A flow velocity of the high-temperature fluid flowing through one of the flow paths, the one being close to the thermoelectric module, is lower than that of the high-temperature fluid flowing through the flow path farther away from the thermoelectric module. Therefore, the efficiency of heat transfer to the thermoelectric module from the high-temperature fluid flowing through the flow path away from the thermoelectric module is reduced.

Because the heat of the high-temperature fluid flowing through the flow path away from the thermoelectric module is difficult to transfer to the thermoelectric module, a contribution rate of that heat to power generation through the thermoelectric module is reduced. As a result, the efficiency of heat transfer to the thermoelectric module from the high-temperature fluid flowing through the flow path away from the thermoelectric module is reduced.

One non-limiting and exemplary embodiment provides a thermoelectric conversion unit capable of increasing the efficiency of heat transfer from a second fluid (high-temperature fluid) to a thermoelectric module.

In one general aspect, the techniques disclosed here feature a thermoelectric conversion unit generating electricity based on a temperature difference between a first fluid and a second fluid at higher temperature than the first fluid, the thermoelectric conversion unit including a pair of first fluid flow path sections through each of which the first fluid flows, the first fluid flow path sections being arranged to face each other, a second fluid flow path section through which the second fluid flows, the second fluid flow path section being arranged between the pair of first fluid flow path sections, a pair of thermoelectric modules each arranged between the second fluid flow path section and one of the pair of first fluid flow path sections in a one-to-one relation, the thermoelectric modules converting thermal energy given by the temperature difference between the first fluid and the second fluid to electrical energy, and heat transfer plates arranged in the second fluid flow path section to face each other along a predetermined direction from one of the pair of thermoelectric modules toward the other, wherein at least one of the heat transfer plates includes an opening and a baffle projecting from a peripheral edge of the opening and baffling the second fluid passing through the opening to flow in a direction toward the one of the pair of thermoelectric modules or the other.

With the thermoelectric conversion unit according to the one general aspect of the present disclosure, the efficiency of heat transfer from the second fluid to the thermoelectric module can be increased.

It should be noted that the above-described generic or specific embodiment may be implemented in the form of a device or a method or may be implemented in a selective combination of a device and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
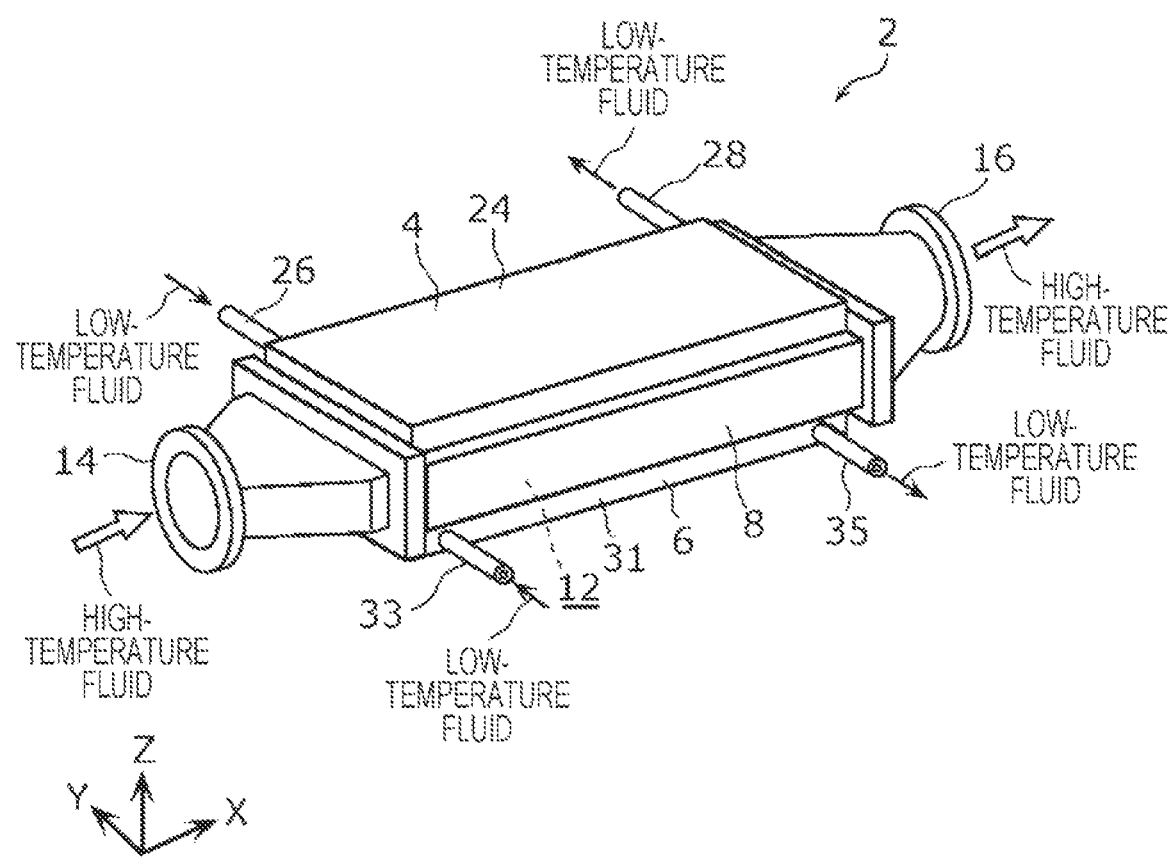
FIG. 1 is a perspective view of a thermoelectric conversion unit according to Embodiment 1.

A thermoelectric conversion unit according to one aspect of the present disclosure generates electricity based on a temperature difference between a first fluid and a second fluid at higher temperature than the first fluid, the thermoelectric conversion unit including a pair of first fluid flow path sections through each of which the first fluid flows, the first fluid flow path sections being arranged to face each other, a second fluid flow path section through which the second fluid flows, the second fluid flow path section being arranged between the pair of first fluid flow path sections, a pair of thermoelectric modules each arranged between the second fluid flow path section and one of the pair of first fluid flow path sections in a one-to-one relation, the thermoelectric modules converting thermal energy given by the temperature difference between the first fluid and the second fluid to electrical energy, and heat transfer plates arranged in the second fluid flow path section to face each other along a predetermined direction from one of the pair of thermoelectric modules toward the other, wherein at least one of the heat transfer plates includes an opening and a baffle projecting from a peripheral edge of the opening and baffling the second fluid passing through the opening to flow in a direction toward the one of the pair of thermoelectric modules or the other.

With the feature described above, part of the second fluid flowing through a region of the second fluid flow path section away from the thermoelectric module is baffled by the baffle of the heat transfer plate to flow in a direction toward the thermoelectric module, whereby the part of the second fluid flows into a region of the second fluid flow path section closer to the thermoelectric module. Accordingly, a flow velocity of the second fluid flowing through the region of the second fluid flow path section closer to the thermoelectric module can be increased, and heat of the second fluid flowing through the region of the second fluid flow path section away from the thermoelectric module can be utilized to contribute to the power generation by the thermoelectric module. As a result, the efficiency of heat transfer from the second fluid to the thermoelectric module can be increased.

Plural sets each including the heat transfer plates and the pair of thermoelectric modules may be stacked in the predetermined direction.

With the feature described above, the thermoelectric conversion unit can be made compact.

The opening and the baffle: may be formed respectively as plural openings and plural baffles, the openings may include a first opening arranged in an upstream region of the second fluid flow path section, a second opening arranged in a midstream region of the second fluid flow path section on a downstream side of the upstream region, and a third opening arranged in a downstream region of the second fluid flow path section on a downstream side of the midstream region, and the baffles may include a first baffle projecting from a peripheral edge of the first opening and baffling the second fluid passing through the first opening to flow in the direction toward the one of the pair of thermoelectric modules, a second baffle projecting from a peripheral edge of the second opening and baffling the second fluid passing through the second opening to flow in the direction toward the other of the pair of thermoelectric modules, and a third baffle projecting from a peripheral edge of the third opening and baffling the second fluid passing through the third opening to flow in the direction toward the one of the pair of thermoelectric modules.

With the feature described above, since a baffle direction for the second fluid baffled by the second baffle disposed in the midstream region of the second fluid flow path section is revered to that of the second fluid baffled by the first baffle disposed in the upstream region of the second fluid flow path section, a flow velocity distribution and a temperature distribution of the second fluid in the midstream region of the second fluid flow path section can be made uniform once. As a result, it is possible to maintain the effect of baffling the second fluid by the third baffle disposed in the downstream region of the second fluid flow path section and to increase the efficiency of heat transfer from the second fluid flowing in the downstream region of the second fluid flow path section to the thermoelectric module.

The baffle may project from the peripheral edge of the opening in a direction opposite to a direction in which the second fluid passes through the opening.

With the feature described above, the second fluid passing through the opening can be efficiently baffled by the baffle.

The heat transfer plates may be composed of flat heat transfer plates and corrugated heat transfer plates that are alternately stacked.

With the feature described above, the heat of the second fluid can be efficiently transferred to the thermoelectric module through the flat heat transfer plates and the corrugated heat transfer plates.

A pair of adjacent ones of the heat transfer plates may be connected to each other with a rod-shaped fin interposed therebetween.

With the feature described above, the heat of the second fluid can be efficiently transferred to the thermoelectric module through the pair of heat transfer plates and the rod-shaped fin therebetween.

An interior and a surface of each of the heat transfer plates may be made of different materials.

The interior of each of the heat transfer plates may be made of copper, a copper alloy, aluminum, an aluminum alloy, stainless, or ceramic.

With the feature described above, the interior of each heat transfer plate can be made of a material with high thermal conductivity.

The surface of each of the heat transfer plates may be made of nickel, a nickel alloy, chromium, or a chromium alloy.

With the feature described above, the surface of each heat transfer plate can be coated with a material with high corrosion resistance. As a result, the interior of each heat transfer plate can be suppressed from being oxidized and corroded in the atmosphere at high temperature.

Those generic or specific embodiments may be implemented in the form of a device or a method or may be implemented in a selective combination of a device and a method.

The embodiments will be described below with reference to the drawings.

It is to be noted that the following embodiments represent generic or specific examples. Numerical values, shapes, materials, constituent elements, layout positions and connection forms of the constituent elements, steps, order of the steps, etc., which are described in the following embodiments, are merely illustrative, and they are not purported to limit the scope of Claims. Ones of the constituent elements in the following embodiments, those ones being not stated in independent claims representing the most significant concept, are explained as optional constituent elements. The drawings are not always exactly drawn in a strict sense. In the drawings, substantially the same constituent elements are denoted by the same reference sings, and duplicate description of those constituent elements is omitted or simplified in some cases.

Embodiment 1

1-1. Overall Structure of Thermoelectric Conversion Unit

Figure 2:
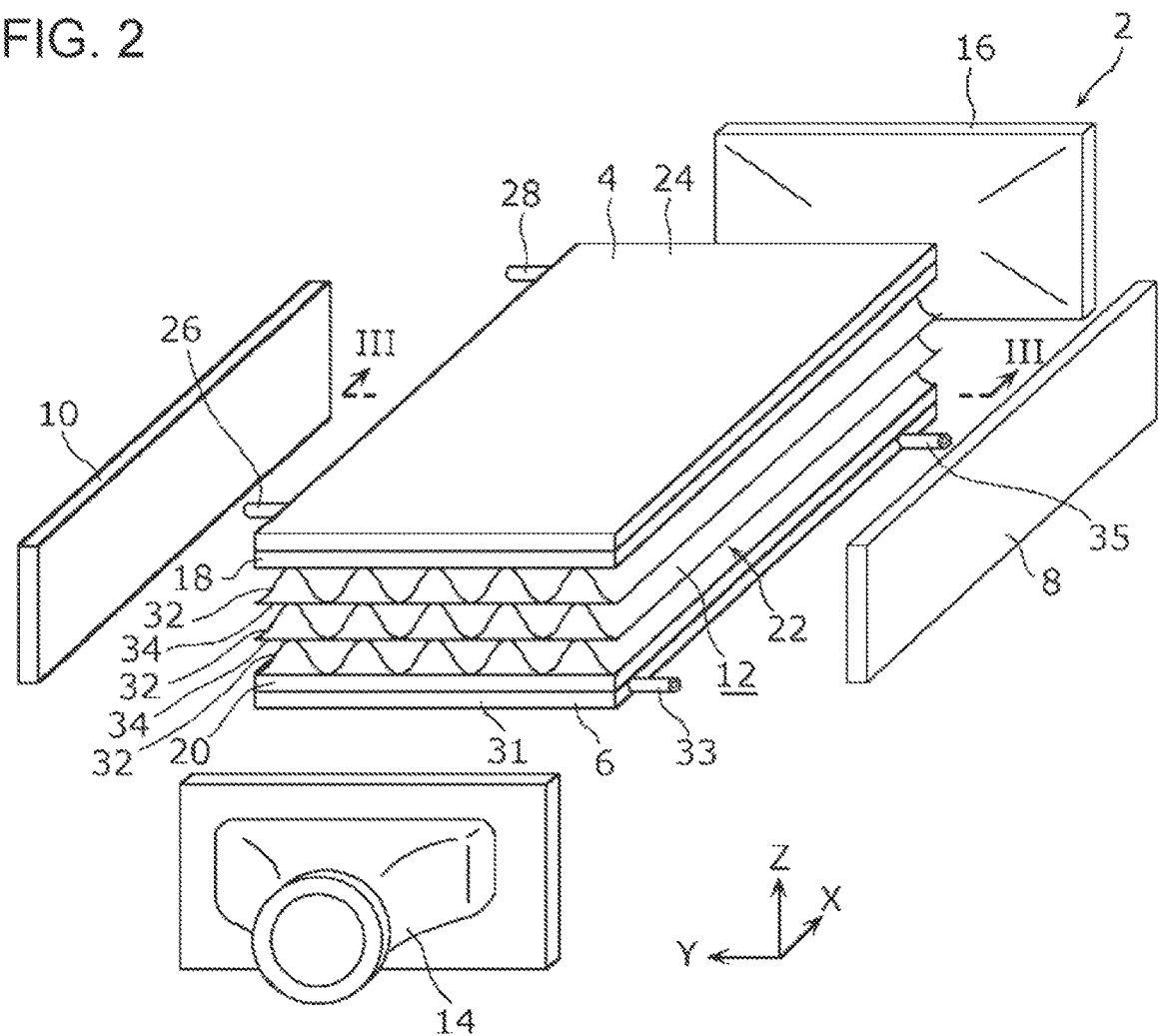
FIG. 2 is an exploded perspective view of the thermoelectric conversion unit according to Embodiment 1.
Figure 3:
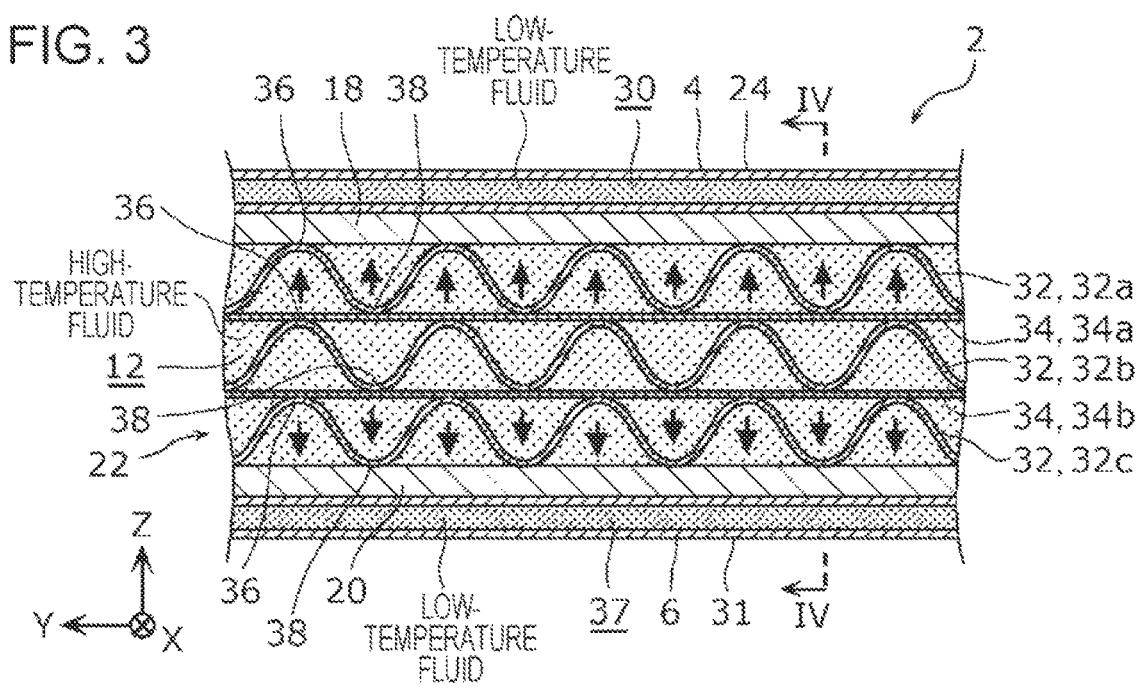
FIG. 3 is a sectional view, taken along a line III-III in FIG. 2, of principal part of the thermoelectric conversion unit according to Embodiment 1.
Figure 4:
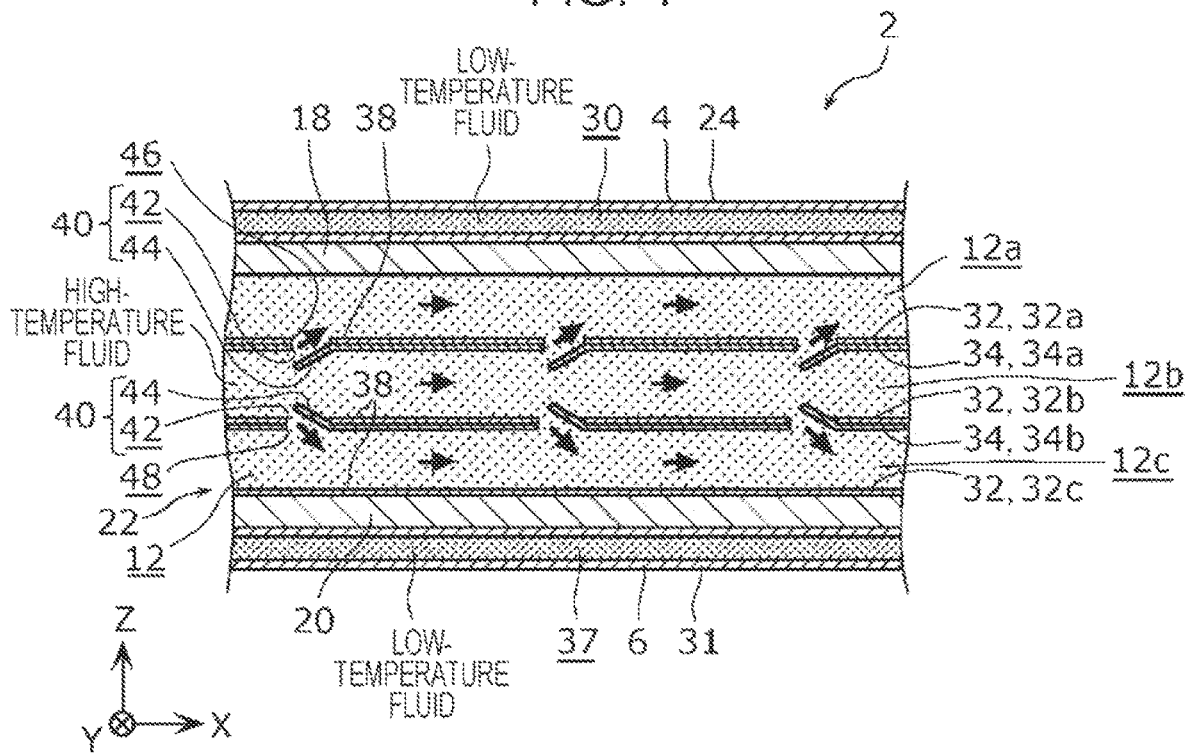
FIG. 4 is a sectional view, taken along a line IV-IV in FIG. 3, of principal part of the thermoelectric conversion unit according to Embodiment 1.

First, an overall structure of a thermoelectric conversion unit 2 according to Embodiment 1 will be described below with reference to FIGS. 1 to 4. FIG. 1 is a perspective view of the thermoelectric conversion unit 2 according to Embodiment 1. FIG. 2 is an exploded perspective view of the thermoelectric conversion unit 2 according to Embodiment 1. FIG. 3 is a sectional view, taken along a line III-III in FIG. 2, of principal part of the thermoelectric conversion unit 2 according to Embodiment 1. FIG. 4 is a sectional view, taken along a line IV-IV in FIG. 3, of principal part of the thermoelectric conversion unit 2 according to Embodiment 1. In FIGS. 1 to 4, a front-rear direction of the thermoelectric conversion unit 2 is referred to as an X-axis direction, a left-right direction of the thermoelectric conversion unit 2 is referred to as a Y-axis direction, and an up-down direction of the thermoelectric conversion unit 2 is referred to as a Z-axis direction.

The thermoelectric conversion unit 2 is a thermoelectric conversion unit for generating electricity by utilizing thermal energy of, for example, exhaust gas discharged from an on-vehicle engine.

As illustrated in FIGS. 1 to 4, the thermoelectric conversion unit 2 includes a pair of low-temperature fluid flow path sections 4 and 6 (an example of a pair of first fluid flow path sections), a pair of side restriction member 8 and 10, a high-temperature fluid flow path section 12 (an example of a second fluid flow path section), a high-temperature fluid introduction member 14, a high-temperature fluid discharge member 16, a pair of thermoelectric modules 18 and 20, and a fin structure 22.

As illustrated in FIGS. 2 to 4, the pair of low-temperature fluid flow path sections 4 and 6 are arranged to face each other with a spacing therebetween in the up-down direction (Z-axis direction).

The low-temperature fluid flow path section 4 on an upper side is composed of a flat and hollow rectangular parallelepiped housing 24, a tubular low-temperature fluid introduction member 26, and a tubular low-temperature fluid discharge member 28, those members 26 and 28 projecting to the outside from a side surface of the housing 24. As illustrated in FIG. 3, a low-temperature fluid flow path 30 through which a low-temperature fluid (an example of a first fluid) flows is formed inside the housing 24. The low-temperature fluid is, for example, cold water or cold air at lower temperature than a high-temperature fluid (described later). The low-temperature fluid introduction member 26 and the low-temperature fluid discharge member 28 are arranged with a spacing therebetween in the front-rear direction (X-axis direction) and are in communication with the low-temperature fluid flow path 30 inside the housing 24. The low-temperature fluid flows into the low-temperature fluid flow path 30 inside the housing 24 through the low-temperature fluid introduction member 26 and is discharged to the outside through the low-temperature fluid discharge member 28 after flowing through the low-temperature fluid flow path 30.

The low-temperature fluid flow path section 6 on a lower side is composed of a flat and hollow rectangular parallelepiped housing 31, a tubular low-temperature fluid introduction member 33, and a tubular low-temperature fluid discharge member 35, those members 33 and 35 projecting to the outside from a side surface of the housing 31. As illustrated in FIG. 3, a low-temperature fluid flow path 37 through which the low-temperature fluid flows is formed inside the housing 31. The low-temperature fluid introduction member 33 and the low-temperature fluid discharge member 35 are arranged with a spacing therebetween in the front-rear direction and are in communication with the low-temperature fluid flow path 37 inside the housing 31. The low-temperature fluid flows into the low-temperature fluid flow path 37 inside the housing 31 through the low-temperature fluid introduction member 33 and is discharged to the outside through the low-temperature fluid discharge member 35 after flowing through the low-temperature fluid flow path 37.

As illustrated in FIGS. 1 and 2, the pair of side restriction members 8 and 10 are arranged to face each other with a spacing therebetween in the left-right direction (Y-axis direction). In more detail, the pair of side restriction members 8 and 10 are arranged to cover the high-temperature fluid flow path section 12 (described later) arranged between the pair of low-temperature fluid flow path sections 4 and 6 from sides in the left-right direction. The pair of side restriction members 8 and 10 are each formed in a rectangular flat plate shape.

As illustrated in FIGS. 2 to 4, the high-temperature fluid flow path section 12 is arranged between the pair of low-temperature fluid flow path sections 4 and 6. More specifically, the high-temperature fluid flow path section 12 is defined by a space surrounded by the pair of low-temperature fluid flow path sections 4 and 6 and the pair of side restriction members 8 and 10. The high-temperature fluid flow path section 12 functions as a high-temperature fluid flow path through which the high-temperature fluid (an example of the second fluid) flows. The high-temperature fluid is a fluid at higher temperature than the low-temperature fluid and is, for example, the exhaust gas discharged from the on-vehicle engine.

The high-temperature fluid introduction member 14 and the high-temperature fluid discharge member 16 are arranged to face each other with a spacing therebetween in the front-rear direction. In more detail, the high-temperature fluid introduction member 14 and the high-temperature fluid discharge member 16 are arranged to cover the high-temperature fluid flow path section 12 arranged between the pair of low-temperature fluid flow path sections 4 and 6 from sides in the front-rear direction. The high-temperature fluid introduction member 14 and the high-temperature fluid discharge member 16 are formed in a tubular shape and are in communication with the high-temperature fluid flow path section 12. The high-temperature fluid flows into the high-temperature fluid flow path section 12 through the high-temperature fluid introduction member 14 and is discharged to the outside through the high-temperature fluid discharge member 16 after flowing through the high-temperature fluid flow path section 12 in the front-rear direction (from a minus side toward a plus side of an X axis).

As illustrated in FIGS. 2 to 4, the pair of thermoelectric modules 18 and 20 are each arranged between the high-temperature fluid flow path section 12 and one of the pair of low-temperature fluid flow path sections 4 and 6 in a one-to-one relation. Thus, the pair of thermoelectric modules 18 and 20 are arranged to face each other with a spacing therebetween in the up-down direction.

The thermoelectric module 18 on an upper side is formed in a rectangular flat plate shape and is fixed to a lower surface (a surface on a side closer to the high-temperature fluid flow path section 12) of the housing 24 of the low-temperature fluid flog path section 4 on the upper side. In other words, the thermoelectric module 18 on the upper side is arranged such that it is sandwiched between the high-temperature fluid flow path section 12 and the low-temperature fluid flow path section 4 on the upper side from below and above, respectively. The thermoelectric module 18 on the upper side includes a thermoelectric generator that converts thermal energy, given as a temperature difference between the high-temperature fluid flowing through the high-temperature fluid flow path section 12 and the low-temperature fluid flowing through the low-temperature fluid flow path section 4 on the upper side, to electrical energy based on the Seebeck effect.

The thermoelectric module 20 on a lower side is formed in a rectangular flat plate shape and is fixed to an upper surface (a surface on a side closer to the high-temperature fluid flow path section 12) of the housing 31 of the low-temperature fluid flow path section 6 on the lower side. In other words, the thermoelectric module 20 on the lower side is arranged such that it is sandwiched between the high-temperature fluid flow path section 12 and the low-temperature fluid flow path section 6 on the lower side from above and below, respectively. The thermoelectric module 20 on the lower side includes a thermoelectric generator that converts thermal energy, given as a temperature difference between the high-temperature fluid flowing through the high-temperature fluid flow path section 12 and the low-temperature fluid flowing through the low-temperature fluid flow path section 6 on the lower side, to electrical energy based on the Seebeck effect.

An example of each of the thermoelectric module 18 and the thermoelectric module 20 may be a TEG module 102 disclosed in U.S. Patent Application Publication No. 2013/0340801. U.S. Patent Application Publication No. 2013/0340801 indicates that the TEG module 102 includes p-type thermoelectric material legs 105A and n-type thermoelectric material legs 105B.

The thermoelectric generator has, for example, a π-structure. In the thermoelectric generator of the π-structure, a p-type thermoelectric material and an n-type thermoelectric material are electrically connected in series through an electrode mounted on a ceramic substrate. One end of each of the thermoelectric materials is arranged on a high temperature side, and the other end is arranged on a low temperature side. Thus, a temperature difference is produced between both the ends of each thermoelectric material and a voltage difference is generated between both ends of the thermoelectric generator, whereby electricity is generated.

As illustrated in FIGS. 2 to 4, the fin structure 22 is arranged in the high-temperature fluid flow path section 12. The fin structure 22 has a role of transferring heat of the high-temperature fluid flowing through the high-temperature fluid flow path section 12 to each of the pair of thermoelectric modules 18 and 20. A configuration of the fin structure 22 will be described in detail below.

1-2. Configuration of Fin Structure

Figure 5:
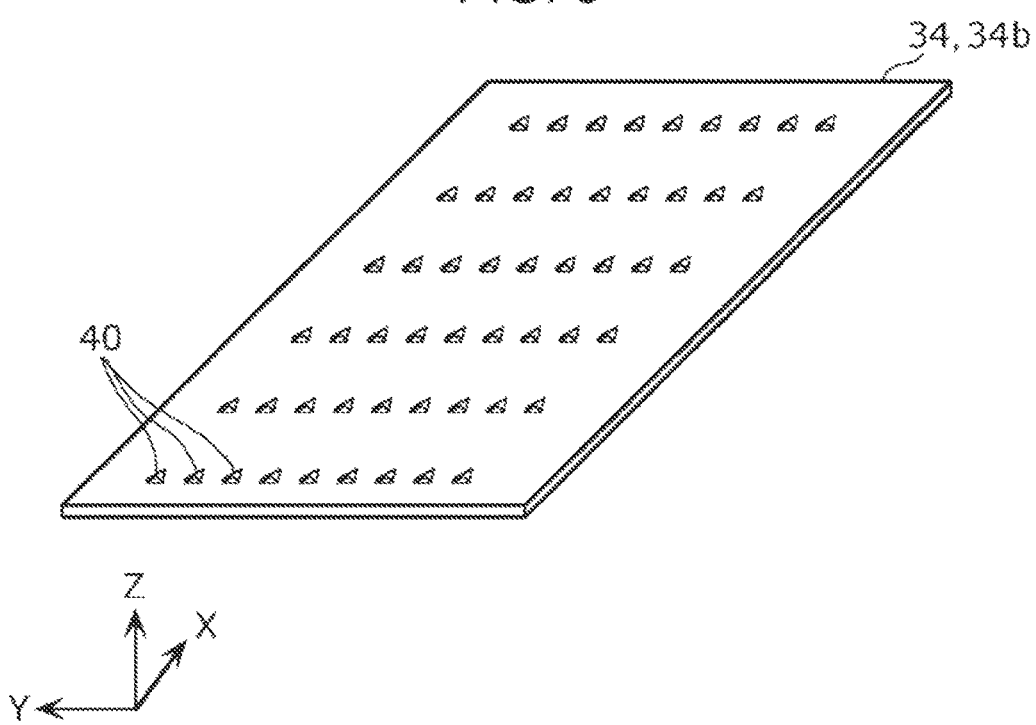
FIG. 5 is a perspective view of a flat heat transfer plate according to Embodiment 1.
Figure 6:
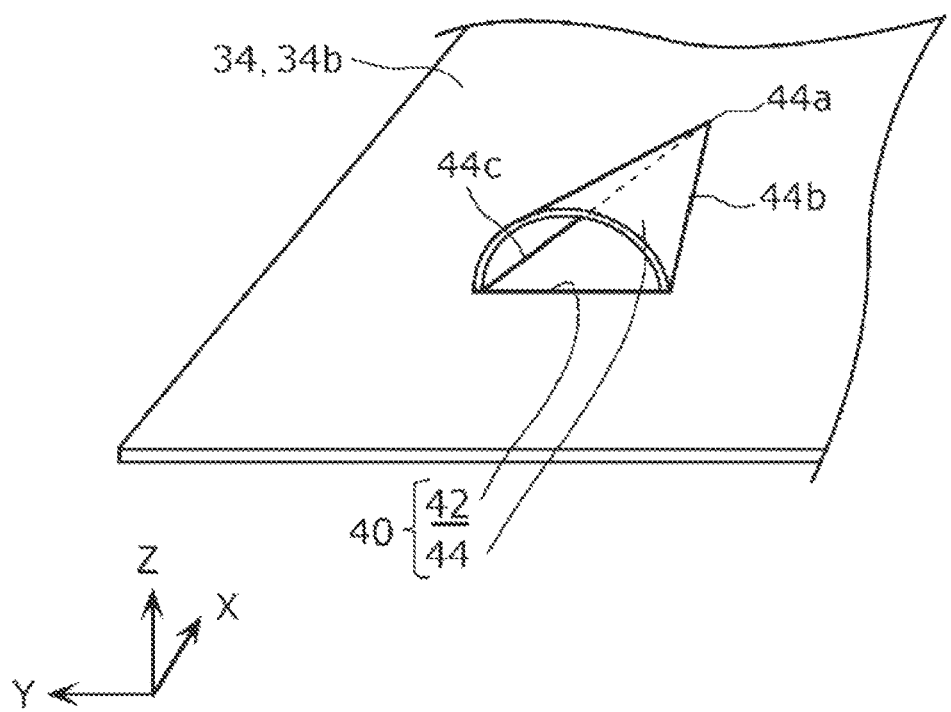
FIG. 6 is an enlarged perspective view illustrating a baffle structure of the flat heat transfer plate illustrated in FIG. 5.

The configuration of the fin structure 22 is described with reference to FIGS. 2 to 6. FIG. 5 is a perspective view of a flat heat transfer plate 34 according to Embodiment 1. FIG. 6 is an enlarged perspective view illustrating a baffle structure 40 of the flat heat transfer plate 34 in FIG. 5.

As illustrated in FIGS. 2 and 3, the fin structure 22 includes corrugated heat transfer plates 32 (32a, 32b and 32c) and the flat heat transfer plates 34 (34a and 34b). The corrugated heat transfer plates 32 and the flat heat transfer plates 34 are alternately stacked in the up-down direction to face each other. In more detail, the corrugated heat transfer plate 32a, the flat heat transfer plate 34a, the corrugated heat transfer plate 32b, the flat heat transfer plate 34b, and the corrugated heat transfer plate 32c are successively stacked in order along a predetermined direction from the thermoelectric module 18 on the upper side toward the thermoelectric module 20 on the lower side.

As illustrated in FIG. 3, the corrugated heat transfer plate 32 is formed by mountain portions 36 curved in a convex shape toward the thermoelectric module 18 on the upper side and valley portions 38 curved in a convex shape toward the thermoelectric module 20 on the lower side, the mountain and valley portions being alternately interconnected in the left-right direction. The flat heat transfer plate 34 is formed in a flat plate (thin plate) shape.

As illustrated in FIG. 3, the mountain portions 36 of the corrugated heat transfer plate 32a on an upper side are each in contact with a lower surface (a surface on a side closer to the high-temperature fluid flow path section 12) of the thermoelectric module 18 on the upper side. The valley portions 38 of the corrugated heat transfer plate 32a on the upper side are each in contact with an upper surface (a surface on a side closer to the corrugated heat transfer plate 32a) of the flat heat transfer plate 34a on the upper side. The mountain portions 36 of the corrugated heat transfer plate 32b at a center are each in contact with a lower surface (a surface on a side closer to the corrugated heat transfer plate 32b) of the flat heat transfer plate 34a on the upper side. The valley portions 38 of the corrugated heat transfer plate 32b at the center are each in contact with an upper surface (a surface on a side closer to the corrugated heat transfer plate 32b) of the flat heat transfer plate 34b on the lower side. The mountain portions 36 of the corrugated heat transfer plate 32c on a lower side are each in contact with a lower surface (a surface on a side closer to the corrugated heat transfer plate 32c) of the flat heat transfer plate 34b on the lower side. The valley portions 38 of the corrugated heat transfer plate 32c on the lower side are each in contact with an upper surface (a surface on a side closer to the high-temperature fluid flow path section 12) of the thermoelectric module 20 on the lower side.

An interior and a surface of each of the corrugated heat transfer plate 32 and the flat heat transfer plate 34 are made of different materials. The interior of each of the corrugated heat transfer plate 32 and the flat heat transfer plate 34 is made of a material with high thermal conductivity, such as copper, a copper alloy, aluminum, an aluminum alloy, stainless, or ceramic. The surface of each of the corrugated heat transfer plate 32 and the flat heat transfer plate 34 is coated with a metal with high corrosion resistance, such as nickel, a nickel alloy, chromium, or a chromium alloy. For example, electrolytic plating, non-electrolytic plating, or thermal spraying can be used to coat the surface of each of the corrugated heat transfer plate 32 and the flat heat transfer plate 34.

Furthermore, as illustrated in FIG. 5, the flat heat transfer plate 34 includes the baffle structures 40 arranged in a lattice pattern. As illustrated in FIG. 6, each of the baffle structures 40 includes an opening 42 formed in the flat heat transfer plate 34 and a baffle 44 projecting from a peripheral edge of the opening 42. The opening 42 is formed in, for example, a triangular shape. The baffle 44 is a projected piece to baffle the high-temperature fluid after passing through the opening 42 in a direction toward the thermoelectric module 18 on the upper side or the thermoelectric module 20 on the lower side. The baffle 44 is formed in, for example, a semi-conical shape. A base portion 44a and both side portions 44b and 44c of the baffle 44 are connected to the peripheral edge of the opening 42. The baffle 44 is formed by, for example, press working such as cutting and bending on a metal plate.

Alternately, the baffle 44 may be formed by welding, for example, without being limited the pressworking.

As illustrated in FIG. 4, openings 46 are formed in the valley portions 38 of the corrugated heat transfer plate 32a on the upper side corresponding to the baffle structures 40 of the flat heat transfer plate 34a on the upper side in a one-to-one relation. The openings 46 of the corrugated heat transfer plate 32a on the upper side are in communication with the openings 42 of the baffle structures 40 of the flat heat transfer plate 34a on the upper side.

Although not illustrated, openings 46 are formed in the mountain portions 36 of the corrugated heat transfer plate 32b at the center corresponding to the baffle structures 40 of the flat heat transfer plate 34a on the upper side in a one-to-one relation. The openings 46 of the corrugated heat transfer plate 32b at the center are in communication with the openings 42 of the baffle structures 40 of the flat heat transfer plate 34a on the upper side.

The baffles 44 of the baffle structures 40 of the flat heat transfer plate 34a on the upper side each project from the peripheral edge of the opening 42 in a direction opposite to the direction in which the high-temperature fluid passes through the opening 42 (namely, toward the thermoelectric module 20 on the lower side) and in an obliquely downward direction relative to the flat heat transfer plate 34a.

As illustrated in FIG. 4, openings 48 are formed in the valley portions 38 of the corrugated heat transfer plate 32b at the center corresponding to the baffle structures 40 of the flat heat transfer plate 34b on the lower side in a one-to-one relation. The openings 48 of the corrugated heat transfer plate 32b at the center are in communication with the openings 42 of the baffle structures 40 of the flat heat transfer plate 34b on the lower side.

Although not illustrated, openings 46 are formed in the mountain portions 36 of the corrugated heat transfer plate 32c on the lower side corresponding to the baffle structures 40 of the flat heat transfer plate 34b on the lower side in a one-to-one relation. The openings 46 of the corrugated heat transfer plate 32c on the lower side are in communication with the openings 42 of the baffle structures 40 of the flat heat transfer plate 34b on the lower side.

The baffles 44 of the baffle structures 40 of the flat heat transfer plate 34b on the lower side each project from the peripheral edge of the opening 42 in the direction opposite to the direction in which the high-temperature fluid passes through the opening 42 (namely, toward the thermoelectric module 18 on the upper side) and in an Obliquely upward direction relative to the flat heat transfer plate 34b.

While, in this embodiment, the baffle structures 40 are formed in the flat heat transfer plate 34, the present disclosure is not limited to the illustrated embodiment, and baffle structures may be formed in the corrugated heat transfer plate 32. In that case, openings are formed in the flat heat transfer plate 34 corresponding to the baffle structures of the corrugated heat transfer plate 32 in a one-to-one relation.

1-3. Operation of Thermoelectric Conversion Unit

Operation of the thermoelectric conversion unit 2 according to Embodiment 1 will be described below with reference to FIGS. 1, 3 and 4.

As illustrated in FIGS. 1, 3 and 4, the low-temperature fluid flows into the low-temperature fluid flow path 30 inside the housing 24 of the low-temperature fluid flow path section 4 on the upper side through the low-temperature fluid introduction member 26 and, after flowing through the low-temperature fluid flow path 30, it is discharged to the outside through the low-temperature fluid discharge member 28. Heat of the low-temperature fluid flowing through the low-temperature fluid flow path section 4 on the upper side is transferred to an upper surface (a surface on a side closer to the low-temperature fluid flow path section 4) of the thermoelectric module 18 on the upper side, whereby the upper surface of the thermoelectric module 1S on the upper side is cooled.

The low-temperature fluid flows into the low-temperature fluid flow path 37 inside the housing 31 of the low-temperature fluid flow path section 6 on the lower side through the low-temperature fluid introduction member 33 and, after flowing through the low-temperature fluid flow path 37, it is discharged to the outside through the low-temperature fluid discharge member 35. Heat of the low-temperature fluid flowing through the low-temperature fluid flow path section 6 on the lower side is transferred to a lower surface (a surface on a side closer to the low-temperature fluid flow path section 6) of the thermoelectric module 20 on the lower side, whereby the lower surface of the thermoelectric module 20 on the lower side is cooled.

As illustrated in FIGS. 1 and 4, the high-temperature fluid flows into the high-temperature fluid flow path section 12 through the high-temperature fluid introduction member 14 and, after flowing through the high-temperature fluid flow path section 12 in the front-rear direction, it is discharged to the outside through the high-temperature fluid discharge member 16.

As illustrated in FIG. 4, the high-temperature fluid flowing through a flow path 12a of the high-temperature fluid flow path section 12 between the thermoelectric module 18 on the upper side and the flat heat transfer plate 34a on the upper side heats the lower surface of the thermoelectric module 18 on the upper side while flowing through the flow path 12a in the front-rear direction. The high-temperature fluid flowing through a flow path 12b of the high-temperature fluid flow path section 12 between the flat heat transfer plate 34a on the upper side and the flat heat transfer plate 34b on the lower side flows through the flow path 12b in the front-rear direction, while part of the above-mentioned high-temperature fluid is baffled by the baffles 44 of the flat heat transfer plate 34a on the upper side to flow in the direction toward the thermoelectric module 18 on the upper side. Hence the part of the above-mentioned high-temperature fluid flows into the flow path 12a through the openings 42 of the flat heat transfer plate 34a on the upper side and the openings 46 of the corrugated heat transfer plate 32a on the upper side.

Thus, the high-temperature fluid flowing through the flow path 12a in the front-rear direction as described above joins with the high-temperature fluid flowing into the flow path 12a from the flow path 12b and heats the lower surface of the thermoelectric module 18 on the upper side while increasing its flow velocity. With such a flow of the high-temperature fluid, the heat of the high-temperature fluid flowing through the high-temperature fluid flow path section 12 is transferred to the lower surface of the thermoelectric module 18 on the upper side through the corrugated heat transfer plate 32b at the center, the flat heat transfer plate 34a on the upper side, and the corrugated heat transfer plate 32a on the upper side. The lower surface of the thermoelectric module 18 on the upper side is heated as described above.

As illustrated in FIG. 4, the high-temperature fluid flowing through a flow path 12c of the high-temperature fluid flow path section 12 between the thermoelectric module 20 on the lower side and the flat heat transfer plate 34b on the lower side heats the upper surface of the thermoelectric module 20 on the lower side while flowing through the flow path 12c in the front-rear direction. The high-temperature fluid flowing through the flow path 12b of the high-temperature fluid flow path section 12 between the flat heat transfer plate 34a on the upper side and the flat heat transfer plate 34b on the lower side flows through the flow path 12b in the front-rear direction, while part of the above-mentioned high-temperature fluid is baffled by the baffles 44 of the flat heat transfer plate 34h on the lower side to flow in the direction toward the thermoelectric module 20 on the lower side. Hence the part of the above-mentioned high-temperature fluid flows into the flow path 12c through the openings 42 of the flat heat transfer plate 34b on the lower side and the openings 48 of the corrugated heat transfer plate 32c on the lower side.

Thus, the high-temperature fluid flowing through the flow path 12c in the front-rear direction as described above joins with the high-temperature fluid flowing into the flow path 12c from the flow path 12b and heats the upper surface of the thermoelectric module 20 on the lower side while increasing its flow velocity. With such a flow of the high-temperature fluid, the heat of the high-temperature fluid flowing through the high-temperature fluid flow path section 12 is transferred to the upper surface of the thermoelectric modules 20 on the lower side through the corrugated heat transfer plate 32b at the center, the flat heat transfer plate 34b on the lower side, and the corrugated heat transfer plate 32c on the lower side. The upper surface of the thermoelectric module 20 on the lower side is heated as described above.

In such a manner, a temperature difference (temperature gradient) is given to the thermoelectric module 18 on the upper side in its thickness direction (Z-axis direction) such that a lower surface side is held at high temperature and an upper surface side is held at low temperature. Therefore, the thermoelectric module 18 on the upper side generates electricity based on the temperature difference between the lower surface side and the upper surface side (i.e., the temperature difference between the high-temperature fluid and the low-temperature fluid).

A temperature difference (temperature gradient) is given to the thermoelectric module 20 on the lower side in its thickness direction (Z-axis direction) such that an upper surface side is held at high temperature and a lower surface side is held at low temperature. Therefore, the thermoelectric module 20 on the lower side generates electricity based on the temperature difference between the upper surface side and the lower surface side (i.e., the temperature difference between the high-temperature fluid and the low-temperature fluid).

1-4. Advantageous Effects

According to this embodiment, as described above, the part of the high-temperature fluid flowing through the flow path 12b is baffled by the baffles 44 of the flat heat transfer plate 34a on the upper side in the direction toward the thermoelectric module 18 on the upper side and hence flows into the flow path 12a through the openings 42 of the flat heat transfer plate 34a on the upper side and the openings 46 of the corrugated heat transfer plate 32a on the upper side. Thus, the high-temperature fluid flowing through the flow path 12a in the front-rear direction joins with the high-temperature fluid flowing into the flow path 12a from the flow path 12b and heats the lower surface of the thermoelectric module 18 on the upper side while increasing its flow velocity.

The part of the high-temperature fluid flowing through the flow path 12h is baffled by the baffles 44 of the flat heat transfer plate 34b on the lower side in the direction toward the thermoelectric module 20 on the lower side and hence flows into the flow path 12c through the openings 42 of the flat heat transfer plate 34b on the lower side and the openings 48 of the corrugated heat transfer plate 32c on the lower side. Thus, the high-temperature fluid flowing through the flow path 12c in the front-rear direction joins with the high-temperature fluid flowing into the flow path 12c from the flow path 12b and heats the upper surface of the thermoelectric module 20 on the lower side while increasing its flow velocity.

Accordingly, it is possible to increase the flow velocity of each of the high-temperature fluid flowing through the flow path 12a close to the thermoelectric module 18 on the upper side and the high-temperature fluid flowing through the flow path 12c close to the thermoelectric module 20 on the lower side. The heat of the high-temperature fluid flowing through the flow path 12b can be utilized to contribute to the power generation by the thermoelectric module 18 on the upper side and the thermoelectric module 20 on the lower side by introducing the parts of the high-temperature fluid flowing through the flow path 12b away from the thermoelectric module 18 on the upper side and the thermoelectric module 20 on the lower side to the flow paths 12a and 12c. As a result, the efficiency of heat transfer from the high-temperature fluid to each of the thermoelectric module 18 on the upper side and the thermoelectric module 20 on the lower side can be increased.

1-5. Modification of Baffle Structure

Figure 7:
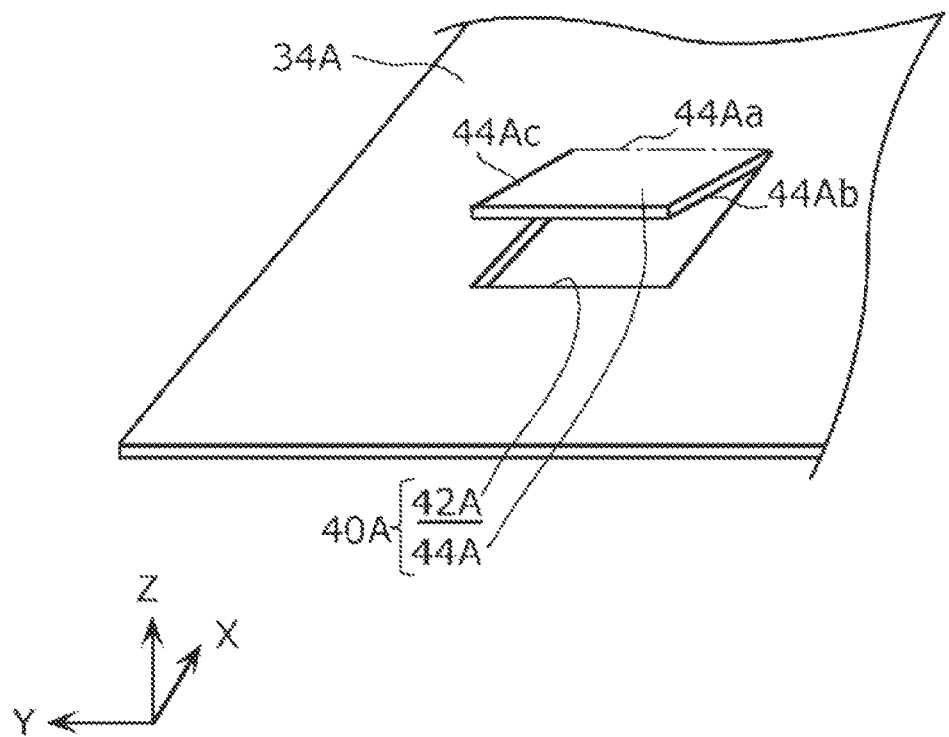
FIG. 7 is a perspective view illustrating a baffle structure of the flat heat transfer plate according to a modification of Embodiment 1.

A configuration of a baffle structure 40A of a flat heat transfer plate 34A according to a modification of Embodiment 1 will be described below with reference to FIG. 7. FIG. 7 is a perspective view illustrating the baffle structure 40A of the flat heat transfer plate 34A according to the modification of Embodiment 1.

As illustrated in FIG. 7, in the baffle structure 40A of the flat heat transfer plate 34A according to the modification, an opening 42A is formed in a rectangular shape, and a baffle 44A is formed in a rectangular flat plate shape. A base portion 44Aa of the baffle 44A is connected to a peripheral edge of the opening 42A, but both side portions 44Ab and 44Ac of the baffle 44A are not connected to the peripheral edge of the opening 42. The baffle 44A is formed by, for example, press working such as cutting and bending on a metal plate. The baffle structure 40A with the above-described configuration can also provide similar advantageous effects to those described above.

1-6. Modification of Corrugated Heat Transfer Plate

Figure 8:
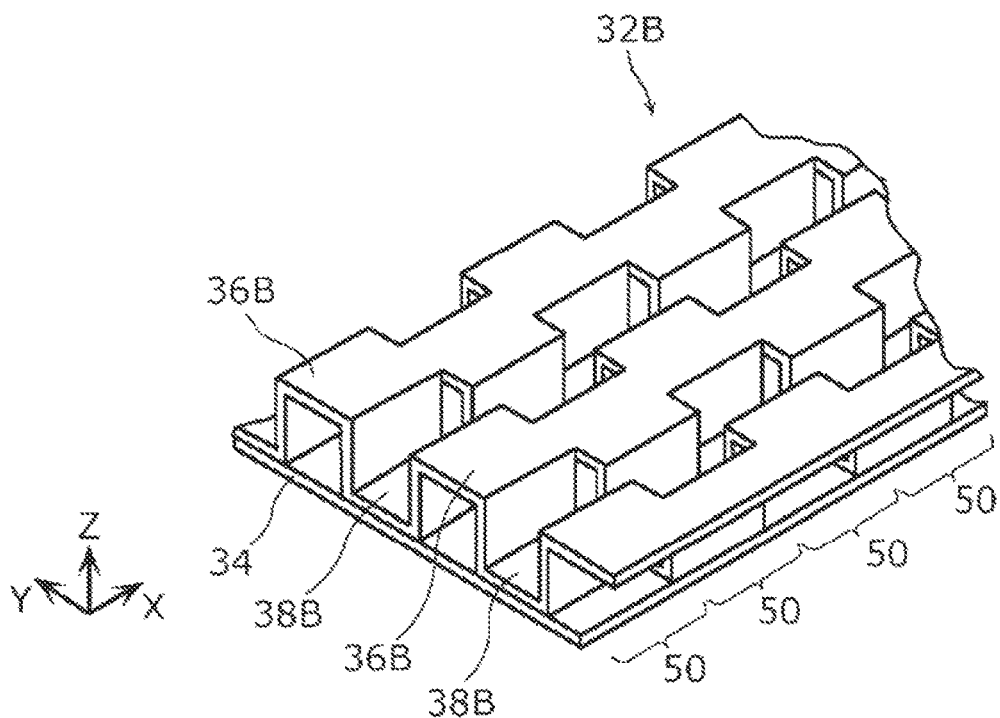
FIG. 8 is a perspective view illustrating a corrugated heat transfer plate according to a modification of Embodiment 1.

A configuration of a corrugated heat transfer plate 32B according to a modification of Embodiment 1 will be described below with reference to FIG. 8. FIG. 8 is a perspective view illustrating the corrugated heat transfer plate 32B according to the modification of Embodiment 1.

As illustrated in FIG. 8, the corrugated heat transfer plate 32B according to the modification has the so-called split fin structure. More specifically, in the corrugated heat transfer plate 32B, concave-convex portion rows 50 each including mountain portions 36B and valley portions 38B arranged alternately are arranged side by side in the front-rear direction of the corrugated heat transfer plate 32B (i.e., in the X-axis direction) and are offset-arrayed such that positions of the mountain portions 36B and the valley portions 38B are shifted in the left-right direction of the corrugated heat transfer plate 32B (i.e., in the Y-axis direction).

The above-described configuration of the corrugated heat transfer plate 32B enables flows of the high-temperature fluid to merge (mix) not only in the up-down direction (Z-axis direction) of the corrugated heat transfer plate 32B, but also in the left-right direction. As a result, it is possible to smooth position dependency of temperature of the high-temperature fluid caused by the difference in heat exchange state, and to increase overall heat transfer performance and thermoelectric conversion performance of the thermoelectric conversion unit.

Embodiment 2

Figure 9:
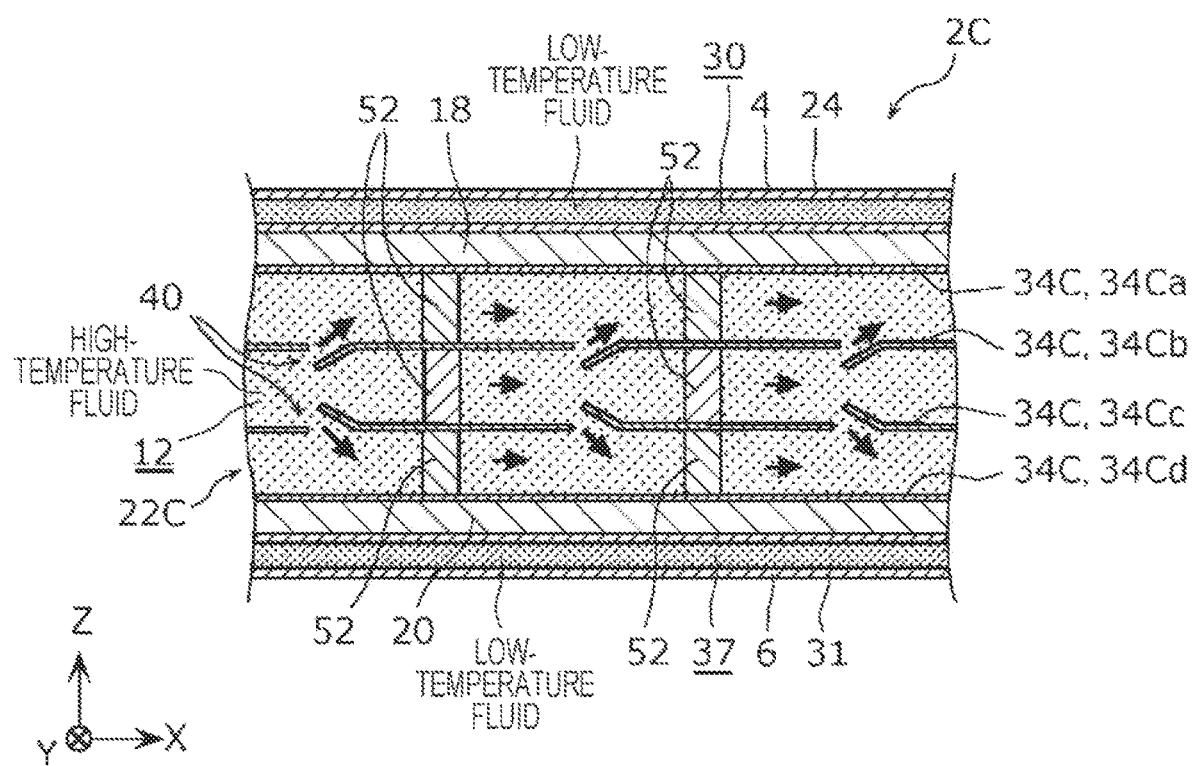
FIG. 9 is a sectional view of principal part of a thermoelectric conversion unit according to Embodiment 2.

A configuration of a thermoelectric conversion unit 2C according to Embodiment 2 will be described below with reference to FIG. 9. FIG. 9 is a sectional view of principal part of the thermoelectric conversion unit 2C according to Embodiment 2. In the following embodiments, the same constituent elements as those in the above-described Embodiment 1 are denoted by the same reference sings, and duplicate description of those constituent elements is omitted.

As illustrated in FIG. 9, the thermoelectric conversion unit 2C according to Embodiment 2 is different from Embodiment 1 in configuration of a fin structure 22C. More specifically, the fin structure 22C includes flat heat transfer plates 34C (34Ca, 34Cb, 34Cc and 34Cd) and rod-shaped fins 52. The tin structure 22C does not include the corrugated heat transfer plate 32 described in Embodiment 1.

The flat heat transfer plates 34C are arranged with a spacing therebetween in the up-down direction. In more detail, the flat heat transfer plates 34Ca, 34Cb, 34Cc and 34Cd are successively arranged in order along the predetermined direction from the thermoelectric module 18 on the upper side toward the thermoelectric module 20 on the lower side. The flat heat transfer plate 34Ca at an uppermost position is fixed to the lower surface of the thermoelectric module 18 on the upper side. The flat heat transfer plate 34Cd at a lowermost position is fixed to the upper surface of the thermoelectric module 20 on the lower side. The baffle structures 40 are formed in each of the flat heat transfer plate 34Cb at a second uppermost position and the flat heat transfer plate 34Cc at a second lowest position as in Embodiment 1.

Each of the rod-shaped fins 52 is formed in a cylindrical rod (pin) shape and is arranged between adjacent pairs 34Ca and 34Cb ((34Cb and 34Cc) or (34Cc and 34Cd)) of the flat heat transfer plates 34C in a one-to-one relation. Both ends of each of the rod-shaped fins 52 are fixed to the adjacent pairs of flat heat transfer plates 34Ca and 34Cb ((34Cb and 34Cc) or (34Cc and 34Cd)). Thus, the adjacent pairs of flat heat transfer plates 34Ca and 34Cb ((34Cb and 34Cc) or (34Cc and 34Cd)) are connected to each other through the rod-shaped fins 52.

The heat of the high-temperature fluid flowing through the high-temperature fluid flow path section 12 is transferred to the pair of thermoelectric modules 18 and 20 through the rod-shaped fins 52 and the flat heat transfer plates 34C. Accordingly, this embodiment can also provide similar advantageous effects to those obtained in Embodiment 1.

Embodiment 3

Figure 10:
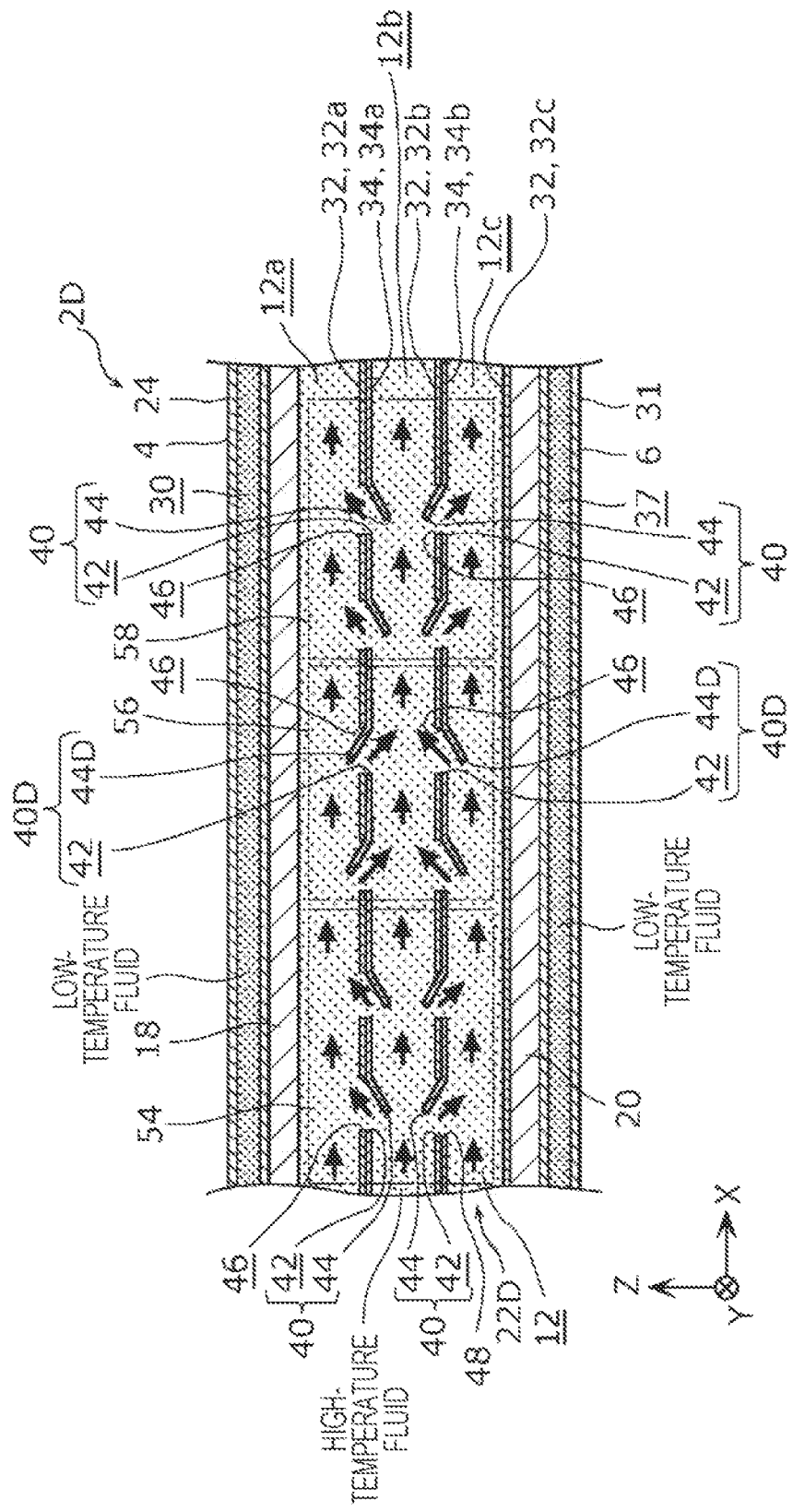
FIG. 10 is a sectional view of principal part of a thermoelectric conversion unit according to Embodiment 3.

A configuration of a thermoelectric conversion unit 2D according to Embodiment 3 will be described below with reference to FIG. 10, FIG. 10 is a sectional view of principal part of the thermoelectric conversion unit 21) according to Embodiment 3.

As illustrated in FIG. 10, the thermoelectric conversion unit 2D according to Embodiment 3 is different from Embodiment 1 in configuration of a fin structure 22D. More specifically, a baffle direction for the high-temperature fluid baffled by baffle structures 40 formed in an upstream region 54 and a downstream region 58 of the high-temperature fluid flow path section 12 is reversal in the up-down direction to a baffle direction for the high-temperature fluid baffled by a baffle structure 40D formed in a midstream region 56 of the high-temperature fluid flow path section 12. The midstream region 56 of the high-temperature fluid flow path section 12 is a region that is positioned on a downstream side (plus side of the X-axis) of the upstream region 54, and the downstream region 58 of the high-temperature fluid flow path section 12 is a region that is positioned on a downstream side of the midstream region 56.

A baffle 44 (an example of a first baffle) of each baffle structure 40 of the flat heat transfer plate 34a on the upper side arranged in the upstream region 54 of the high-temperature fluid flow path section 12 projects from the peripheral edge of the opening 42 (an example of a first opening) in the direction opposite to the direction in which the high-temperature fluid passes through the opening 42 (namely, toward the thermoelectric module 20 on the lower side) and in an obliquely downward direction relative to the flat heat transfer plate 34a. In other words, the baffle direction for the high-temperature fluid baffled by the baffle structure 40 of the flat heat transfer plate 34a on the upper side arranged in the upstream region 54 of the high-temperature fluid flow path section 12 is a direction toward the thermoelectric module 18 on the upper side.

A baffle 44D (an example of a second baffle) of each baffle structure 40D of the flat heat transfer plate 34a on the upper side arranged in the midstream region 56 of the high-temperature fluid flow path section 12 projects from the peripheral edge of the opening 42 (an example of a second opening) in the direction opposite to the direction in which the high-temperature fluid passes through the opening 42 (namely, toward the thermoelectric module 18 on the upper side) and in an obliquely upward direction relative to the flat heat transfer plate 34a. In other words, the baffle direction for the high-temperature fluid baffled by the baffle structure 40D of the flat heat transfer plate 34a on the upper side arranged in the midstream region 56 of the high-temperature fluid flow path section 12 is a direction toward the thermoelectric module 20 on the lower side.

A baffle 44 (an example of a third baffle) of each baffle structure 40 of the flat heat transfer plate 34a on the upper side arranged in the downstream region 58 of the high-temperature fluid flow path section 12 projects from the peripheral edge of the opening 42 (an example of a third opening) in the direction opposite to the direction in which the high-temperature fluid passes through the opening 42 (namely, toward the thermoelectric module 20 on the lower side) and in an obliquely downward direction relative to the flat heat transfer plate 34a. In other words, the baffle direction for the high-temperature fluid baffled by the baffle 44 of the baffle structure 40 of the flat heat transfer plate 34a on the upper side arranged in the downstream region 58 of the high-temperature fluid flow path section 12 is the direction toward the thermoelectric module 18 on the upper side.

A baffle 44 (an example of the first baffle) of each baffle structure 40 of the flat heat transfer plate 34b on the lower side arranged in the upstream region 54 of the high-temperature fluid flow path section 12 projects from the peripheral edge of the opening 42 (an example of the first opening) in the direction opposite to the direction in which the high-temperature fluid passes through the opening 42 (namely, toward the thermoelectric module 18 on the upper side) and in an obliquely upward direction relative to the flat heat transfer plate 34b. In other words, the baffle direction for the high-temperature fluid baffled by the baffle structure 40 of the flat heat transfer plate 34b on the lower side arranged in the upstream region 54 of the high-temperature fluid flow path section 12 is direction toward the thermoelectric module 20 on the lower side.

A baffle 44D (an example of the second baffle) of each baffle structure 40D of the flat heat transfer plate 34b on the lower side arranged in the midstream region 56 of the high-temperature fluid flow path section 12 projects from the peripheral edge of the opening 42 (an example of the second opening) in the direction opposite to the direction in which the high-temperature fluid passes through the opening 42 (namely, toward the thermoelectric module 20 on the lower side) and in an obliquely downward direction relative to the flat heat transfer plate 34b. In other words, the baffle direction for the high-temperature fluid baffled by the baffle structure 40D of the flat heat transfer plate 34b on the lower side arranged in the midstream region 56 of the high-temperature fluid flow path section 12 is the direction toward the thermoelectric module 18 on the upper side.

A baffle 44 (an example of the third baffle) of each baffle structure 40 of the flat heat transfer plate 34b on the lower side arranged in the downstream region 58 of the high-temperature fluid flow path section 12 projects from the peripheral edge of the opening 42 (an example of the third opening) in the direction opposite to the direction in which the high-temperature fluid passes through the opening 42 (namely, toward the thermoelectric module 18 on the upper side) and in an obliquely upward direction relative to the flat heat transfer plate 34b. In other words, the baffle direction for the high-temperature fluid baffled by the baffle 44 of the baffle structure 40 of the flat heat transfer plate 34b on the lower side arranged in the downstream region 58 of the high-temperature fluid flow path section 12 is the direction toward the thermoelectric module 20 on the lower side.

The advantageous effects obtained with the thermoelectric conversion unit 2D according to Embodiment 3 will be described below. Part of the high-temperature fluid flowing through the flow path 12b of the high-temperature fluid flow path section 12 is baffled by the baffles 44 of the flat heat transfer plate 34a on the upper side in the direction toward the thermoelectric module 18 on the upper side, those baffles 44 being arranged in the upstream region 54 of the high-temperature fluid flow path section 12, and hence flows into the flow path 12a through the openings 42 of the flat heat transfer plate 34a on the upper side and the openings 46 of the corrugated heat transfer plate 32a on the upper side. Part of the high-temperature fluid flowing through the flow path 12b of the high-temperature fluid flow path section 12 is baffled by the baffles 44 of the flat heat transfer plate 34b on the lower side in the direction toward the thermoelectric module 20 on the lower side, those baffles 44 being arranged in the upstream region 54 of the high-temperature fluid flow path section 12, and hence flows into the flow path 12c through the openings 48 of the corrugated heat transfer plate 32b at the center and the openings 42 of the flat heat transfer plate 34b on the lower side. On that occasion, when a pressure difference between the flow path 12a and the flow path 12b and a pressure difference between the flow path 12b the flow path 12c reach a certain value, a further baffle effect is lost.

According to this embodiment, taking into account the above-mentioned point, in the midstream region 56 of the high-temperature fluid flow path section 12, part of the high-temperature fluid flowing through the flow path 12a of the high-temperature fluid flow path section 12 is baffled by the baffles 44 of the flat heat, transfer plate 34a on the upper side to flow in the direction toward the thermoelectric module 20 on the lower side, whereby the part of the high-temperature fluid flows into the flow path 12b through the openings 46 of the corrugated heat transfer plate 32a on the upper side and the openings 42 of the flat heat transfer plate 34a on the upper side. Furthermore, in the midstream region 56 of the high-temperature fluid flow path section 12, part of the high-temperature fluid flowing through the flow path 12c of the high-temperature fluid flow path section 12 is baffled by the baffles 44 of the flat heat transfer plate 34b on the lower side to flow in the direction toward the thermoelectric module 18 on the upper side, whereby the part of the high-temperature fluid flows into the flow path 12b through the openings 42 of the flat heat transfer plate 34b on the lower side and the openings 48 of the corrugated heat transfer plate 32b at the center.

Accordingly, a flow velocity distribution and a temperature distribution of the high-temperature fluid in the midstream region 56 of the high-temperature fluid flow path section 12 can be made uniform once. As a result, it is possible to maintain the effect of baffling the high-temperature fluid by the baffles 44 disposed in the downstream region 58 of the high-temperature fluid flow path section 12 and to increase the efficiency of heat transfer from the high-temperature fluid flowing in the downstream region 58 of the high-temperature fluid flow path section 12 to each of the pair of thermoelectric modules 18 and 20.

Embodiment 4

Figure 11:
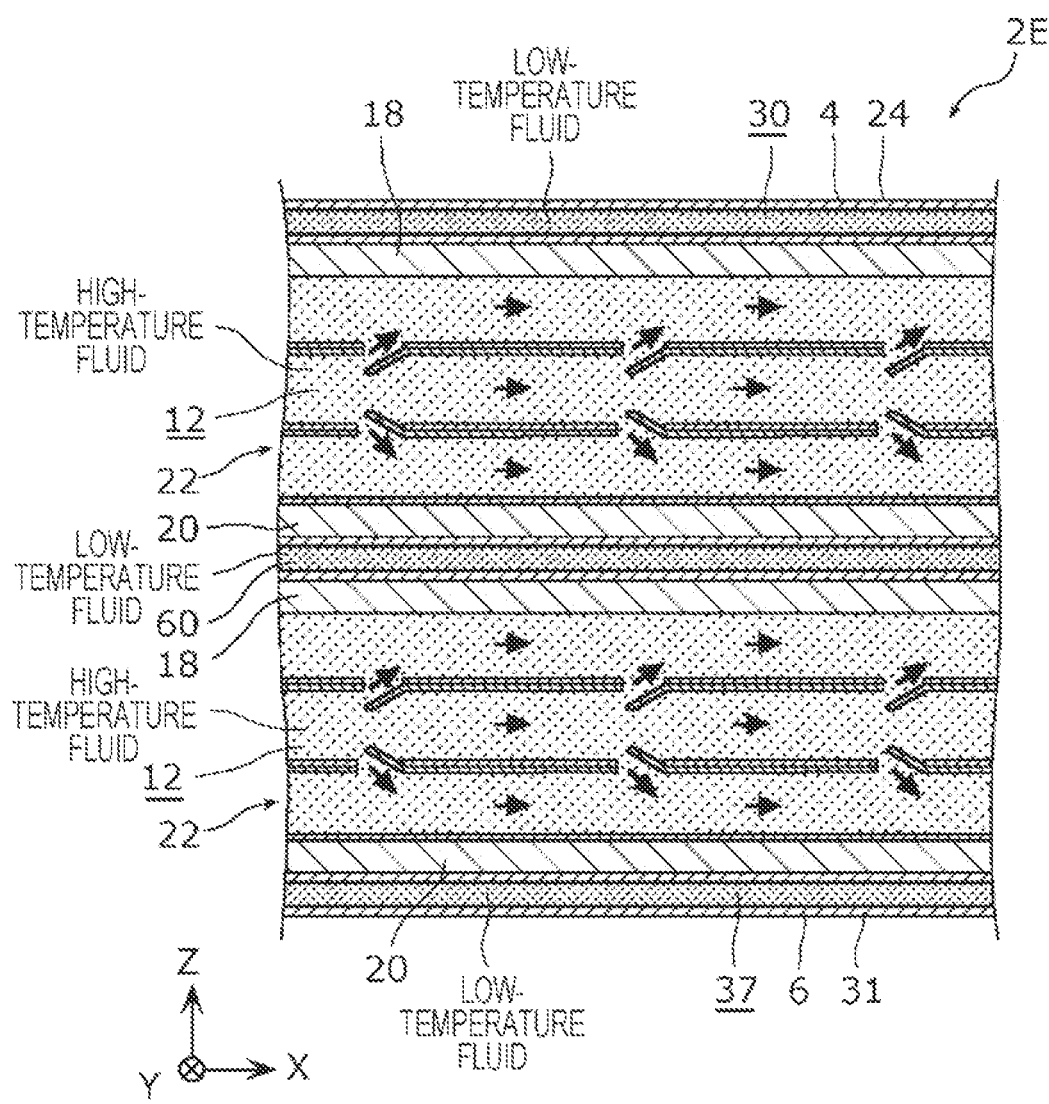
FIG. 11 is a sectional view of principal part of a thermoelectric conversion unit according to Embodiment 4.

A configuration of a thermoelectric conversion unit 2E according to Embodiment 4 will be described below with reference to FIG. 11. FIG. 11 is a sectional view of principal part of the thermoelectric conversion unit 2E according to Embodiment 4.

As illustrated in FIG. 11, in the thermoelectric conversion unit 2E according to Embodiment 4, two sets of units each including the pair of thermoelectric modules 18 and 20 and the fin structure 22 between both the thermoelectric modules are stacked (arranged one on the other) in the up-down direction with a low-temperature fluid flow path section 60 at a center interposed between those two sets of units. The low-temperature fluid flow path section 60 has the same structure as the above-described pair of low-temperature fluid flow path sections 4 and 6. The above-mentioned stack structure enables the thermoelectric conversion unit 2E to be made compact.

While, in this embodiment, the two sets of units each including the pair of thermoelectric modules 18 and 20 and the fin structure 22 between both the thermoelectric modules are stacked in the up-down direction, the present disclosure is not limited to that case, and three or more sets may be stacked.

OTHER EMBODIMENTS

The thermoelectric conversion unit according to one or more aspects of the present disclosure has been described in connection with the embodiments, but the present disclosure is not limited to those embodiments, Various modifications conceivable by those skilled in the art from the above-described embodiments may also fall within the scope of the one or more aspects of the present disclosure insofar as not departing from the gist of the present disclosure.

While the above-described embodiments employ the exhaust gas as the high-temperature fluid and cold water or cold air as the low-temperature fluid, the present disclosure is not limited to that case, and each of the high-temperature fluid and the low-temperature fluid may be any suitable liquid or gas (gaseous medium).

The thermoelectric conversion unit according to the present disclosure can be used as, for example, a power generator generating electricity by utilizing thermal energy of exhaust gas discharged from an automobile, a factory, and so on, or as a small-sized portable power generator and so on.

What is claimed is:

1. A thermoelectric conversion unit for generating electricity based on a temperature difference between a first fluid and a second fluid at a higher temperature than the first fluid, the thermoelectric conversion unit comprising:
   first fluid flow path sections for flow of the first fluid therethrough, the first fluid flow path sections facing each other;
   a second fluid flow path section for flow of the second fluid therethrough, the second fluid flow path section being between the first fluid flow path sections;
   a first thermoelectric module and a second thermoelectric module each configured to convert thermal energy given by the temperature difference between the first fluid and the second fluid to electrical energy, the first thermoelectric module being between the second fluid flow path section and one of the first fluid flow path sections, and the second thermoelectric module being between the second fluid flow path section and an other of the first fluid flow path sections; and
   heat transfer plates in the second fluid flow path section, the heat transfer plates facing each other along a direction from the first thermoelectric module toward the second thermoelectric module,
   wherein at least one of the heat transfer plates includes:
   an opening; and
   a baffle projecting from a peripheral edge of the opening and being configured to baffle the second fluid passing through the opening to flow in a direction toward the first thermoelectric module or the second thermoelectric module, and
   wherein the heat transfer plates include flat heat transfer plates and corrugated heat transfer plates that are alternately stacked.

2. The thermoelectric conversion unit according to claim 1,
   wherein plural sets each including the heat transfer plates, the first thermoelectric module and the second thermoelectric module are stacked in a direction from the first thermoelectric module toward the second thermoelectric module.

3. The thermoelectric conversion unit according to claim 1, wherein:
   the opening is one of plural openings defined in the heat transfer plates, respectively,
   the baffle is one of plural baffles defined in the heat transfer plates, respectively;
   the plural openings include:
   a first opening in an upstream region of the second fluid flow path section;
   a second opening in a midstream region of the second fluid flow path section downstream of the upstream region; and
   a third opening in a downstream region of the second fluid flow path section downstream of the midstream region, and
   the baffles include:
   a first baffle projecting from a peripheral edge of the first opening and being configured to baffle the second fluid passing through the first opening to flow in a direction toward one of the first thermoelectric module or the second thermoelectric module;
   a second baffle projecting from a peripheral edge of the second opening and being configured to baffle the second fluid passing through the second opening to flow in a direction toward the other of the first thermoelectric module or the second thermoelectric module; and
   a third baffle projecting from a peripheral edge of the third opening and being configured to baffle the second fluid passing through the third opening to flow in the direction toward the one of the first thermoelectric module or the second thermoelectric module.

4. The thermoelectric conversion unit according to claim 1,
   wherein the baffle projects from the peripheral edge of the opening in a direction opposite to a direction in which the second fluid is configured to pass through the opening.

5. The thermoelectric conversion unit according to claim 1,
   wherein an interior of each of the heat transfer plates is made of a different material than a surface of each of the heat transfer plates.

6. The thermoelectric conversion unit according to claim 5,
   wherein the interior of each of the heat transfer plates is made of copper, a copper alloy, aluminum, an aluminum alloy, a stainless material, or a ceramic material.

7. The thermoelectric conversion unit according to claim 5,
   wherein the surface of each of the heat transfer plates is made of nickel, a nickel alloy, chromium, or a chromium alloy.

8. A thermoelectric conversion unit comprising:
   a first flow path;
   a second flow path:
   a third flow path between the first flow path and the second flow path;
   a first device between the first flow path and the third flow path, the first device being configured to convert thermal energy given by a difference between a temperature of a first fluid flowing through the first flow path and a temperature of a third fluid flowing through the third flow path to electrical energy;
   a second device between the second flow path and the third flow path, the second device being configured to convert thermal energy given by a difference between a temperature of a second fluid flowing through the second flow path and the temperature of the third fluid to electrical energy;
   a heat transfer plate including an opening; and
   a surface rising from the heat transfer plate into a fourth flow path,
   wherein:
   the surface covers the opening with a space defined between the first surface and the opening;
   the heat transfer plate and the surface are in the third flow path, the third flow path including the fourth flow path and a fifth flow path, and the heat transfer plate being between the fourth flow path and the fifth flow path;
   the thermoelectric conversion unit is configured to move a fluid from the fourth flow path to the fifth flow path such that the fluid passes through the space and further through the opening; and the heat transfer plate is one of plural heat transfer plates including flat heat transfer plates and corrugated heat transfer plates that are alternately stacked.

9. The thermoelectric conversion unit according to claim 8, wherein the temperature of the third fluid is higher than the temperature of the first fluid and the temperature of the second fluid.

* * * * *